United States Patent [19]

Jay et al.

[11] Patent Number: 4,529,997
[45] Date of Patent: Jul. 16, 1985

[54] PERMEABLE BASE TRANSISTOR

[75] Inventors: Paul R. Jay; Christian Rumelhard, both of Paris, France

[73] Assignee: Thomson-CSF, Paris, France

[21] Appl. No.: 417,591

[22] Filed: Sep. 13, 1982

[30] Foreign Application Priority Data

Oct. 16, 1981 [FR] France .............................. 81 19530

[51] Int. Cl.³ ...................... H01L 29/80; H01L 23/48
[52] U.S. Cl. .......................................... 357/22; 357/68
[58] Field of Search ................. 357/22 V, 22 GR, 68, 357/22 G

[56] References Cited

U.S. PATENT DOCUMENTS 3,354,362 11/1967 Zuleeg .................................... 357/22
3,381,189 4/1968 Hinkle et al. .......................... 357/22
3,571,675 3/1971 Faust ...................................... 357/22

FOREIGN PATENT DOCUMENTS 1317256 12/1961 France .
2303383 10/1976 France .
WO81/00489 2/1981 PCT Int'l Appl. .

OTHER PUBLICATIONS

IEEE Transactions on Electron Devices, vol. ED-19, #3, 3/72, "Gridistor Development for the Microwave Power Region" by Teszner.

Primary Examiner—Andrew J. James
Assistant Examiner—Mark Prenty
Attorney, Agent, or Firm—Oblon, Fisher, Spivak, McClelland & Maier

[57] ABSTRACT

A vertical channel field effect transistor is disclosed which has a specialized grid structure in order to improve the characteristics. The improved field effect transistor utilizes an arrangement of two sets of parallel teeth which intersect to form a mesh-like structure in order to produce conduction filaments. The device is particularly applicable to field effect transistor structures which have two-grid transistors.

2 Claims, 8 Drawing Figures

PERMEABLE BASE TRANSISTOR

BACKGROUND OF THE INVENTION

The invention relates to a vertical channel field effect transistor, which is also called a permeable base transistor (PBT), as well as to the process for producing this transistor.

A transistor having a structure of this type has already been made. The active part of the grid of such a transistor consists of a comb-shaped portion formed from parallel teeth. A transistor of this type is formed by superimposing four layers, namely a type n+ gallium arsenide (GaAs) substrate, a type n layer forming the source, a comb-shaped tungsten film forming the grid and a type n layer forming the drain. The regions forming the source and the drain are surrounded by a gallium arsenide layer made insulating by a proton bombardment. The electrons coming from the region forming the source are forced to pass through the grid to reach the drain by the presence of insulating zones. The tungsten layer forming the transistor grid forms a Schottky contact with the gallium arsenide making it possible to control the passage of electrons between source and drain. The concentration of carriers is adjusted in such a way that the width of the transition zone for a zero polarization voltage of the Schottky contact is approximately double the space between the teeth of the comb forming the grid. Metallic coatings provide the ohmic contacts for the different electrodes.

Compared with conventional field effect transistors, the present permeable base transistor offers the following advantages:

a vertical structure permitting a better control of phenomena within the transistor;
the electron flow passing from the source to the drain is controlled by the thickness of the grid, which is smaller than the grid width in planar technology and consequently reduces the electron transit time,
the possibility of epitaxy above the grid.

On the basis of theoretical considerations, the maximum oscillating frequency with devices of this type is approximately 200 GHz. However, such transistors suffer from a number of disadvantages, particularly a high resistance of the grid due to its shape, as well as a considerable risk of the grid teeth breaking, so as to make important parts thereof unusable.

BRIEF SUMMARY OF THE INVENTION

In order to obviate these disadvantages, the present invention proposes replacing the control means of the comb-shaped conduction channel according to the prior art by an arrangement of two sets of parallel teeth, which intersect to form a mesh-like structure, in order to produce conduction filaments. This structure can be connected to an outer face of the transistor by any random side of its periphery.

This construction offers the advantages of a lower ohmic resistance of the grid, a greater reliability during use with respect to the risk of teeth breaking and a larger effective grid surface per unit of gallium arsenide surface.

The present invention therefore relates to a field effect transistor of the type having a buried grid and a vertical channel, incorporating a doped, monocrystalline, semiconductor substrate on which are successively deposited by epitaxy several layers doped with the same type of conductivity as the substrate, the base of the substrate and the top of the final epitaxied layer respectively carrying the ohmic source and drain contacts, said transistor also having control conductor means, conduction between source and drain being distributed within the said epitaxied layers and following a group of insulated collateral zones defined by the control conductor means, wherein these collateral zones form a matrix arrangement in the cross-section of the channel.

The process for the production of the transistor according to the invention involves the same stages as for the production of the prior art PBT transistors, except for the production of the grid electrode for which the method used involves an electron beam and mask or electron scanning.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

The fundamental idea of the invention is to further break down the conduction channel connecting source and drain, in order that the passage of electrons takes place along conduction filaments. Apriori this way of controlling the conduction channel may appear more complex than in the prior art. However, the advantages which occur are due to the geometry of the permeable base transistor. Thus, in this type of transistor, use is made of the limited distance between the drain and the source, so that epitaxy can take place under very satisfactory conditions. This epitaxy causes no particular problems, even in the case of a large number of conduction filaments.

Figure 1:
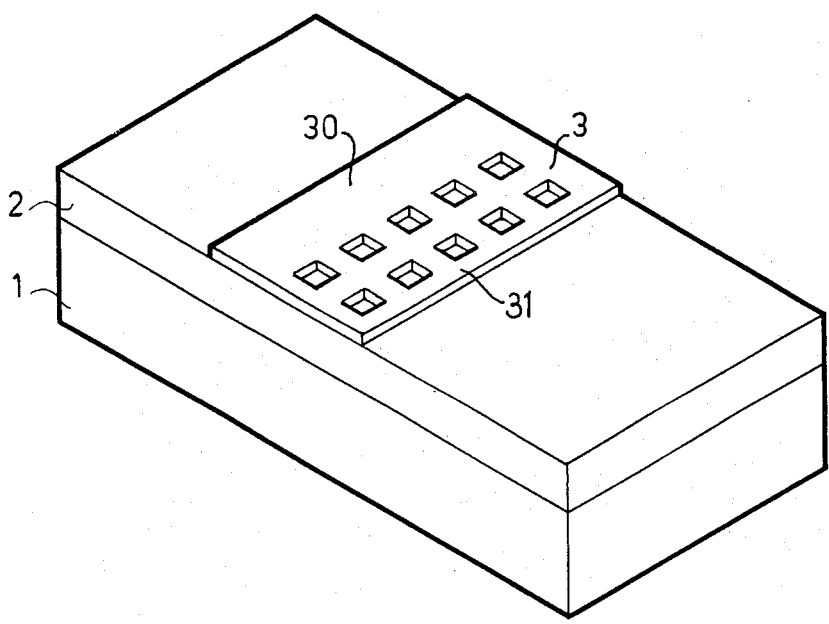
FIG. 1 a transistor according to the invention during a stage of its production process.

A portion of the transistor according to the invention is shown during production in the perspective view of FIG. 1. The field effect transistor according to the invention is of the vertical channel type and is generally called a permeable base transistor. It is made from a semiconductor material, e.g. monocrystalline gallium arsenide (GaAs). A type n layer 2 is produced by epitaxy on a substrate 1 formed from a gallium arsenide layer given a type n+ conductivity by the introduction of impurities. This epitaxy can take place on the basis of a $AsCl_3$-Ga-$H_2$ system, or by an organometallic process, or by a molecular jet.

By using a resin sensitive to the electron beam and by a mask, the grid electrode 3 is then produced in the form of a metallic film, e.g. of tungsten. The advantage of tungsten is that it is sufficiently inert with respect to gallium arsenide and the other products used during epitaxy.

The grid electrode can be in the form of a plate perforated by square or rectangular windows in the manner shown in FIG. 1. The thickness of this electrode can be a few hundred angstroms. The dimensions of the windows are dependent on the function to be fulfilled by the transistor. Only a few windows are shown in FIG.

1, for simplification reasons, but the grid electrode can have a large number thereof. It is also pointed out that the surface of edge or border 30 between the windows and one side of the grid electrode is wider than the other edges or borders of the electrode, particularly edge or border 31 opposite to 30. Edge 30 ensures contacting between electrode 3 and an external grid contact making it possible to connect the transistor grid to another element. It is made wider that the other edges to ensure that it is not covered during the following epitaxy.

Figure 2:
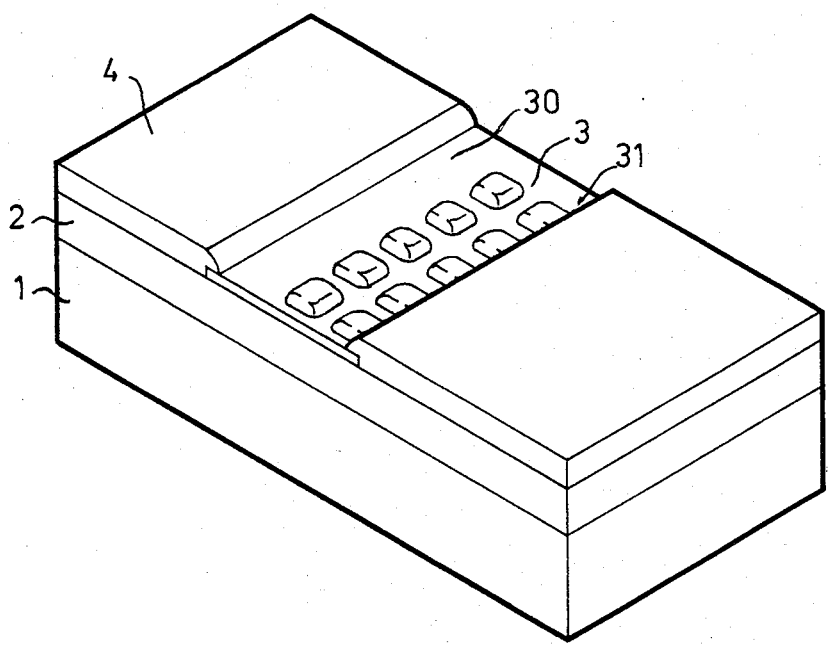
FIG. 2 a more advanced phase of the production of the transistor.

FIG. 2 shows the following stage relating to the growth of the gallium arsenide monocrystal for forming a second epitaxial layer, 4. FIG. 2 shows the start of growth of layer 4, which takes place by the windows of the grid electrode and on the sides of said electrode. The gaps between the windows and edge 31 opposite to edge 30 of the grid electrode and the gaps between the windows themselves are relatively small, so that the epitaxial growths in these areas tend to join as it is demonstrated by the mushroom shapes formed from the windows and the epitaxial overflow on edge 31. However, edge 30 is made sufficiently wide to ensure that the epitaxial overflow does not entirely cover it. It is even possible to cover edge 30 with a mask to prevent burrs of epitaxied material from impairing electrical contacting on the grid electrode.

The growth of the type n gallium arsenide through the meshes of the tungsten electrode make it possible to produce a diode by Schottky contact. The transition between the concentrations of carriers of the two epitaxial layers must be gradual and the thickness of these layers is approximately a few tenths of a micron.

Figure 3:
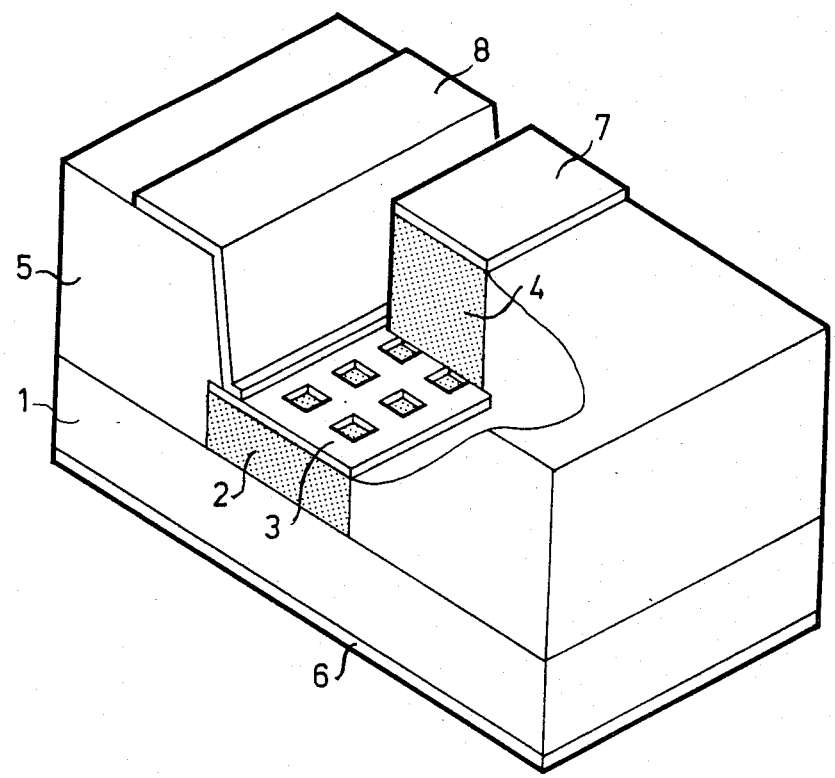
FIG. 3 an isometric view of a transistor according to the invention in which there is a cutout.
Figure 4:
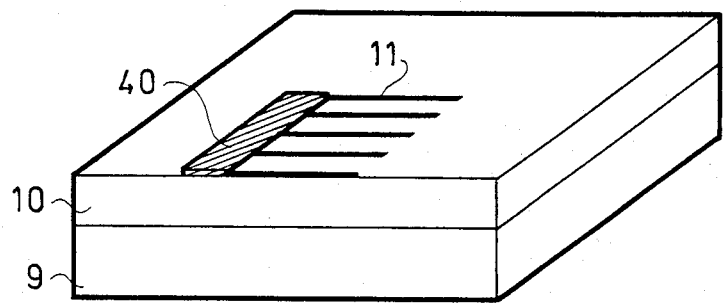
FIGS. 4 to 8 stages in the production process of a two-grid transistor according to the invention.

FIG. 3 is an isometric view of the transistor according to the invention in which a cutout is formed, so as to reveal part of the grid electrode. Once epitaxy of layer 4 has taken place, an ohmic drain contact 7 is deposited on said layer facing grid electrode 3. One of the consequences of the lattice structure of the grid electrode is that it can be joined to the external contact by any random point of its periphery.

The surface of the drain contact is determined by the power and minimum noise level required of the transistor. Its thickness can be a few microns. It can be formed by successive deposits of nickel, germanium and gold in order to constitute a good ohmic contact.

In order to render insulating the gallium arsenide zone surrounding the active zone of the transistor and in this way form a clearly defined channel facing drain contact 7, the epitaxial layers are e.g. bombarded by protons. The channel formed by zones 2 and 4, masked by the drain contact remains of type n.

The grid contact 8, penetrating up to the interior of the transistor, can then be produced by cathodic sputtering of nickel, germanium and gold. In the same way it is possible to produce the source contact 6, which can extend over a larger surface than the drain contact, as shown in FIG. 3. FIG. 3 shows insulating zone 5 and the conduction channel formed from parts 2 and 4. The interstice existing between contacts 7 and 8 can be filled with an insulating material. It also falls within the scope of the invention to place two grid contacts on an outer face of the transistor. The two contacts can then be arranged symmetrically with respect to the drain contact and are joined to one another by a conductor of the same type. The object of this device is to reduce the resistance of the grid. It is then necessary to have a sufficiently wide grid electrode edge 30 to prevent its overlap or covering.

In the case of field effect transistors constructed by planar technology, the addition of a second grid enables the transistor to fulfill new functions, such as the control of voltages in amplitude or phase and the mixing of frequencies.

In the case of a permeable base transistor, a two-grid device can be manufactured on the basis of the single grid transistor described hereinbefore. As stated in the introduction to the present application, the invention consists of producing conduction filaments, e.g. by arranging two sets of intersecting parallel teeth. In the case of a single grid transistor, it is advantageous to superimpose these two sets in order to obtain a lattice or mesh-like structure. It is then possible to produce a two-grid transistor by arranging the second set of parallel teeth on the surface of a thin epitaxial layer, which has been grown above the first set.

In the known two-grid field effect transistors, the two grids have an identical shape and the second grid is aligned with the first grid for electrons migrating from the source to the drain. A serious problem which then occurs in the case of permeable base transistors is to bring about this alignment in the case of buried grids. In addition, serious problems are caused by the connections from the buried electrodes to the surface of the transistor. On the basis of the single grid transistor described hereinbefore, the problems referred to hereinbefore in connection with the two-grid transistor can be obviated by an e.g. orthogonal intersection of the two sets of grid electrodes.

FIGS. 4 to 8 show stages in the production process of a two-grid transistor according to the invention.

A considerable proportion of this production process involves the same stages as for the production of a single grid transistor. In the form of a non-limitative embodiment, the description relates to a transistor with a type n channel. In the stage shown in FIG. 4, the technology used does not differ from that referred to hereinbefore, i.e. epitaxy of type n semiconductor layer 10 on a n+ doped gallium arsenide substrate 9 and deposition of a first comb 11 in the form of a tungsten film using e.g. the method of masking a resin and its etching by an electron beam.

This comb has parallel teeth or bars, interconnected by a transverse member 40, which is wider and thicker than the teeth. It is possible to connect the teeth by another member, positioned opposite to the first member with respect to the teeth in order to form a connecting frame.

Figure 5:
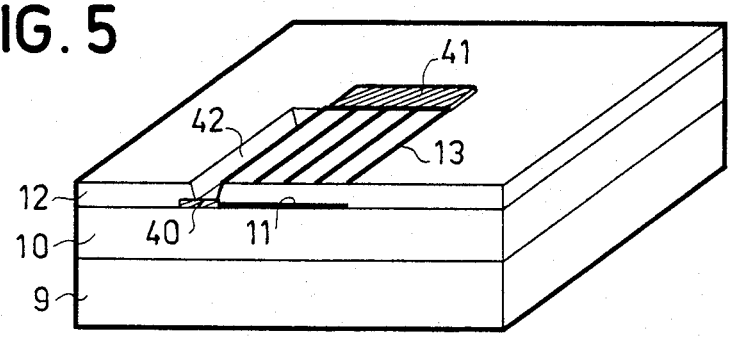

In the stage shown in FIG. 5, another type n epitaxial layer 12 has been grown and has the same doping as layer 10, on which another tungsten comb 13 has been deposited by the same method as for the first and is orthogonal to the latter. Like comb 11, comb 13 is formed from parallel teeth interconnected by at least one transverse member or bar 41, which is wider and thicker than the teeth. It is also possible to see a break or crack 42 in layer 12, due to the dimensions of member 40, which has prevented epitaxy from taking place above its location. Combs 11 and 13 will form the two grids of the transistor.

Figure 6:
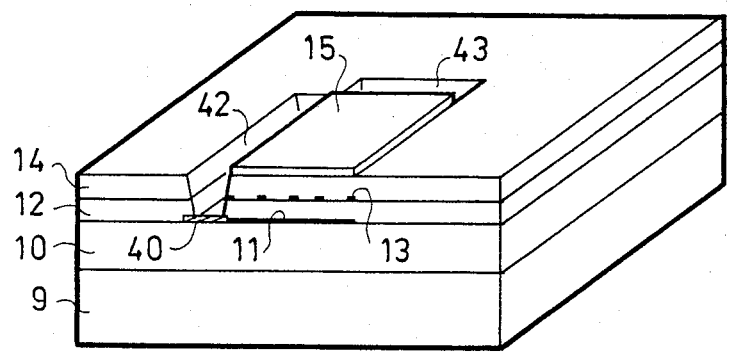

At the stage shown in FIG. 6, there is a type n epitaxial layer 14 on which has been deposited a drain contact 15, e.g. by successive deposits of nickel, germanium and gold. The break 43 in layer 14 is caused by bar 41 and breaks 42 and 43 will ensure the contacting on the grid electrodes.

Figure 7:
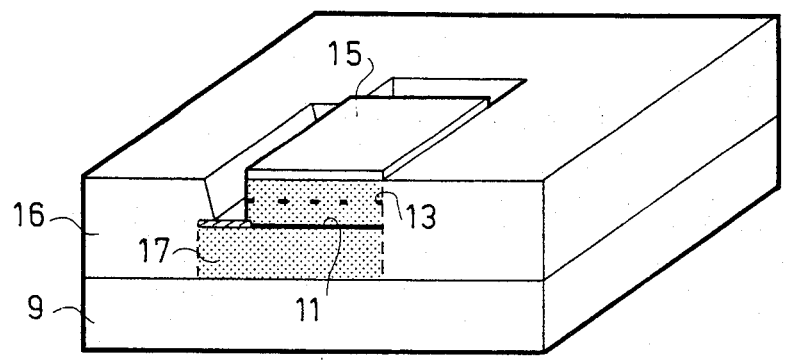

At the stage shown in FIG. 7, proton bombardment has rendered insulating those parts of layers 10, 12 and 14 left uncovered by contact 15 in order to form insulating zone 16 and a channel 17 passing from layer 9 to drain contact 15 and defined by the surface of said contact.

Figure 8:
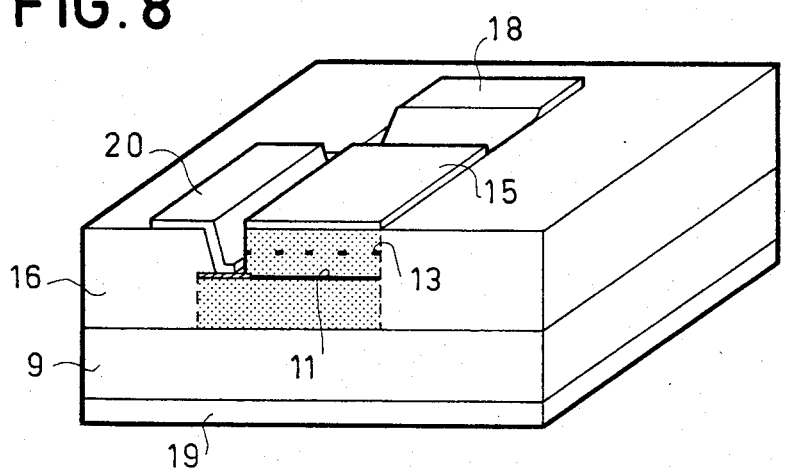

In the stage shown in FIG. 8, grid contacts 20 and 18 have been deposited on the surface of layer 16. These contacts penetrate layer 16 to ensure an electrical connection, respectively with grids 11 and 13 at the locations of said grids, where bars 40 and 41 have prevented epitaxial covering. These contacts can be produced by cathodic sputtering of nickel, germanium and gold. A source contact 19 is deposited in the same way.

As for the single grid transistor, it is possible to double the grid contacts in order to reduce their ohmic resistance. The outputs of each grid takes place e.g. symmetrically with respect to the drain contact. The grid electrodes can also be in the form of perforated plates. In this case the conduction filaments are provided, but there is once again the problem of the relative positioning of the grid electrodes.

The above description has only related to the construction of a single transistor from a substrate for reasons of simplification, but it still falls within the scope of the invention to produce a plurality of transistors on the same substrate in accordance with the prior art.

The construction of a field effect transistor according to the invention makes it possible to obtain a more reliable product and having a grid electrode, whose ohmic resistance is lower than that of the known transistors using the same channel structure.

It also falls within the scope of the invention to produce its transistors for a silicon substrate.

On the basis of the production principle of the single grid transistor, it has been possible to produce a two-grid, vertical structure transistor and thus obtain the advantages inherent in this type of transistor, i.e. high frequency of use and low noise level.

What is claimed is:

1. A field effect transistor of the type having two buried grids and a vertical channel, comprising:
   a doped monocrystalline semiconductor substrate on which are successively deposited by epitaxy several layers doped with the same type of conductivity as said substrate wherein the base of said substrate and the final one of said epitaxied layers respectively have ohmic source and drain contacts;
   conduction control means comprising said two buried grids for controlling conduction between said source and said drain wherein a first and a second one of said two buried grids comprises an arrangement of first and second sets of parallel teeth, respectively, wherein said first set of teeth is spaced from and orthogonal to said second set of teeth in order to form a mesh-like structure which provides a distributed conduction between said source and said drain;
   means for joining each of said sets of parallel teeth to an access contact.

2. A transistor according to claim 1 wherein each of said buried grids further include at least one connecting bar connecting each of said parallel teeth and wherein said access contacts is connected to each of said at least one connecting bar of each of said buried grids.

* * * * *